United States Patent
Kawashima et al.

(10) Patent No.: US 8,133,807 B2
(45) Date of Patent: Mar. 13, 2012

(54) SUBSTRATE FOR TRANSPARENT ELECTRODES

(75) Inventors: Takuya Kawashima, Tokyo (JP); Hiroshi Matsui, Tokyo (JP); Kenichi Okada, Tokyo (JP); Nobuo Tanabe, Tokyo (JP)

(73) Assignee: Fujikura Ltd., Tokyo (JP)

( * ) Notice: Subject to any disclaimer, the term of this patent is extended or adjusted under 35 U.S.C. 154(b) by 313 days.

(21) Appl. No.: 12/113,654

(22) Filed: May 1, 2008

(65) Prior Publication Data

US 2008/0237760 A1    Oct. 2, 2008

Related U.S. Application Data

(62) Division of application No. 10/371,344, filed on Feb. 20, 2003, now Pat. No. 7,396,580.

(30) Foreign Application Priority Data

Feb. 26, 2002 (JP) .................... 2002-050421
Jan. 17, 2003 (JP) .................... 2003-009758

(51) Int. Cl.
    *H01L 21/44* (2006.01)
(52) U.S. Cl. ......... 438/609; 257/E21.159; 257/E31.124; 257/E31.126
(58) Field of Classification Search .............. 438/609; 257/E31.124, E31.126, E21.159
    See application file for complete search history.

(56) References Cited

U.S. PATENT DOCUMENTS

| | | | |
|---|---|---|---|
| 4,265,974 A * | 5/1981 | Gordon ............... | 428/432 |
| 4,719,152 A | 1/1988 | Ohta et al. | |
| 5,097,358 A | 3/1992 | Ito et al. | |
| 5,923,457 A * | 7/1999 | Byker et al. ............ | 359/271 |
| 6,106,689 A | 8/2000 | Matsuyama | |
| 6,184,057 B1 * | 2/2001 | Van Andel et al. ........ | 438/66 |
| 6,362,414 B1 | 3/2002 | Fujisawa et al. | |
| 6,426,492 B1 | 7/2002 | Bos et al. | |
| 6,444,898 B1 | 9/2002 | Fujisawa et al. | |
| 6,593,593 B2 | 7/2003 | Shinohara et al. | |

FOREIGN PATENT DOCUMENTS

| | | |
|---|---|---|
| EP | 0969518 A2 | 1/2000 |
| EP | 0983972 A2 | 3/2000 |
| EP | 1054454 A2 | 11/2000 |
| EP | 1164603 A2 | 12/2001 |
| JP | S59-149607 | 8/1984 |
| JP | H01-132004 | 5/1989 |
| JP | H02-094210 | 4/1990 |
| JP | H04-230906 | 8/1992 |
| JP | H06-338223 | 12/1994 |
| JP | 09-063954 | 3/1997 |
| JP | H10-053418 | 2/1998 |
| JP | H10-130097 | 5/1998 |
| JP | 07-249316 | 9/2005 |

* cited by examiner

OTHER PUBLICATIONS

Kawashima et al., "New Transparent Conductive Films: FTO Coated ITO", Thin Solid Films, 444, 241-244 (2003).

*Primary Examiner* — Stephen W Smoot
*Assistant Examiner* — Vicki B Booker
(74) *Attorney, Agent, or Firm* — Hoffman & Baron, LLP

(57) ABSTRACT

One object of the present invention is to provide a transparent electrode substrate with an ITO film formed thereon, used for example as the transparent electrode plate in a dye sensitized solar cell, for which the electrical resistance does not increase even when exposed to high temperatures of 300° C. or higher. In order to achieve the object, the present invention provides a substrate for a transparent electrode, wherein two or more layers of different transparent conductive films are formed on a transparent substrate, and an upper layer transparent conductive film has a higher heat resistance than that of a lower layer transparent conductive film.

9 Claims, 1 Drawing Sheet

SUBSTRATE FOR TRANSPARENT ELECTRODES

CROSS-REFERENCE TO RELATED APPLICATIONS

This application is a divisional application of co-pending U.S. application Ser. No. 10/371,344, filed on Feb. 20, 2003 and claims priority to Japanese Patent Application Nos. 2002-050421 filed on Feb. 26, 2002 and 2003-009758 filed on Jan. 17, 2003. The entirety of the aforementioned applications are incorporated herein by reference.

BACKGROUND OF THE INVENTION

1. Field of the Invention

The present invention relates to a transparent electrode substrate for use in transparent electrode plates and the like of devices such as liquid crystal display elements and solar cells, and in particular to a transparent electrode substrate with increased heat resistance.

2. Description of the Related Art

Transparent electrode plates of liquid crystal display elements and solar cells and the like typically use a transparent substrate such as glass, on which is provided a thin film of thickness 50 to 1,000 nm of indium oxide doped with several percent of tin, known as an indium tin oxide film (hereafter abbreviated as an ITO film).

However, although this ITO film has excellent transparency and a high level of conductivity, it suffers from deteriorating heat resistance at temperatures over 300° C.

Namely, when ITO films are exposed to a high temperature of 300° C. or higher, the electrical resistance of the ITO film increases more than three times, and the conductivity decreases markedly. It is thought that the reason for this behavior that on heating, oxygen from the atmosphere bonds to a portion of the oxygen vacant structures within the ITO film, reducing the oxygen vacancies which functions as a passage for electrons.

Consequently, if this type of transparent electrode plate with an ITO film formed thereon is used, for example, to make a dye sensitized solar cell, then a paste formed from fine oxide powder such as titanium oxide is coated on the surface of the ITO film of the transparent electrode plate, and the paste is calcinated at a temperature of 400 to 600° C. to form porous oxide semiconductor film. However, during this process, the conductivity of the ITO film of the transparent electrode plate deteriorates markedly. As a result the photoelectric conversion efficiency of the dye sensitized solar cell also deteriorates.

For example, Japanese Unexamined Patent Applications, First Publication Nos. Hei 7-249316 and Hei 9-063954 disclose the conventional transparent electrode plate.

Accordingly, an object of the present invention is to provide a transparent electrode substrate with an ITO film formed thereon, used for example as the transparent electrode plate in a dye sensitized solar cell, for which the electrical resistance does not increase even when exposed to high temperatures of 300° C. or higher.

SUMMARY OF THE INVENTION

In order to achieve the above object, the present invention provides a substrate for a transparent electrode, wherein two or more layers of different transparent conductive films are formed on a transparent substrate, and the upper layer transparent conductive film has a higher heat resistance than the lower layer transparent conductive film.

According to the substrate for a transparent electrode, even if this substrate for a transparent electrode is exposed to high temperatures of 300° C. or higher, the electrical resistance does not increase, and the transparency does not deteriorate.

In the substrate for a transparent electrode, it is preferable for the increase in the electrical resistance of the upper layer transparent conductive film on heating at 300 to 700° C. to be suppressed to an increase of no more than two times, and for the increase in the electrical resistance of the lower layer transparent conductive film on heating at 300° C. or higher to be at least 1.5 times.

In the substrate for a transparent electrode, it is also preferable for two or more layers of different transparent conductive films to be formed on a transparent substrate, for at least one of the layers other than the uppermost layer to be an ITO film, and for a transparent conductive film for which the increase in the electrical resistance on heating at 300 to 700° C. is suppressed to no more than two times to be formed on top of the ITO film.

In the substrate for a transparent electrode, it is also preferable for the transparent conductive film laminated on top of the ITO film to be prepared by a spray pyrolysis deposition method (hereafter referred to as a SPD method).

In the substrate for a transparent electrode, it is also preferable for the transparent conductive film laminated on top of the ITO film to be formed consecutively and immediately after the formation of the ITO film.

According to the substrate for a transparent electrode, since during the formation of a highly heat resistant transparent conductive film different from an ITO film on top of the ITO film, by forming the heat resistant film consecutively and immediately after the formation of the ITO film, the ITO film does not undergo oxidation deterioration during the heat resistant film formation operation, and no loss occurs in the original high conductivity and transparency of the ITO film. As a result, a transparent electrode substrate with superior heat resistance, conductivity and transparency can be obtained.

In the substrate for a transparent electrode, it is also preferable for at least one transparent conductive film other than the ITO film to comprise one or more transparent conductive films selected from a group consisting of fluorine doped tin oxide (hereafter referred to as a FTO film), antimony doped tin oxide (hereafter referred to as a ATO film), tin oxide, fluorine doped zinc oxide, aluminum doped zinc oxide, gallium doped zinc oxide (hereafter referred to as a GZO film), boron doped zinc oxide, and zinc oxide.

In addition, in order to achieve the above object, the present invention provides a substrate for a transparent electrode wherein an ITO film is provided on a transparent substrate, a FTO film is provided on this ITO film, and the thickness of the ITO film is 100-1000 nm.

According to the substrate for a transparent electrode, it is possible to provide a substrate for a transparent electrode having high transparency.

In the substrate for a transparent electrode, it is preferable for the thickness of the FTO film to be 30-350 nm. In addition, the thickness of the FTO film is more preferably to 100-350 nm, and most preferably to 150-350 nm.

According to the substrate for a transparent electrode, it is possible to provide a substrate for a transparent electrode having improved heat resistance in which resistance is not increased by heating at 250-700° C.

In addition, in order to achieve the above object, the present invention provides a method of producing a substrate for a transparent electrode, wherein the film formation temperature of an ITO film is 280° C. or higher when producing the substrate for a transparent electrode by providing the ITO film on a transparent substrate by means of a SPD method and by providing a FTO film on the ITO film.

Furthermore, in order to achieve the above object, the present invention provides another method of producing a substrate for a transparent electrode, wherein the film formation temperature of a FTO film is 360-440° C. when producing the substrate for a transparent electrode by providing an ITO film on a transparent substrate by means of a SPD method and by providing the FTO film on the ITO film.

When carrying out film formation of the ITO film and FTO film by a SPD method, by setting the film formation temperature of the ITO film to 280° C. or higher, a low-resistance transparent conducting film can be formed, and by setting the film formation temperature of the FTO film to 360-440° C., a transparent conducting film having high heat resistance can be formed without increasing the resistance even if heated at 300° C. or higher.

In addition, in order to achieve the above object, the present invention provides a photoelectric conversion element using the substrate for a transparent electrode as a transparent electrode plate.

Furthermore, in order to achieve the above object, the present invention provides a dye sensitized solar cell using the substrate for a transparent electrode as a transparent electrode plate.

According to the dye sensitized solar cell, since it uses the transparent electrode substrate described above as a transparent electrode plate, and consequently even when heated to a high temperature during the calcination of an oxide semiconductor porous film, the low electrical resistance of the transparent electrode plate is maintained, enabling the production of a solar cell with a high degree of photoelectric conversion efficiency.

DETAILED DESCRIPTION OF THE PREFERRED EMBODIMENTS

As follows is a more detailed description of the present invention based on a series of embodiments.

Figure 1:
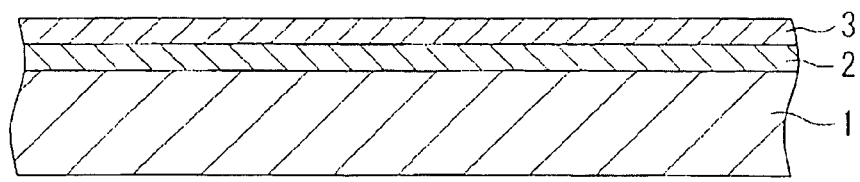
FIG. 1 is a schematic cross-sectional diagram showing an example of a substrate for a transparent electrode according to the present invention.

FIG. 1 is a diagram showing one example of a substrate for a transparent electrode according to the present invention. In the figure, numeral 1 represents a transparent substrate. This transparent substrate 1 is a glass plate of thickness 0.3 to 5 mm formed from a glass such as soda glass, heat resistant glass or quartz glass.

A first transparent conductive film comprising an ITO film 2 is formed on one surface of the glass plate of the transparent substrate 1. This ITO film 2 is a thin film formed by a thin film formation means such as a sputtering method, CVD method, and SPD method. This ITO film 2 has good conductivity and transparency, and if the film thickness becomes thick, the conductivity as a transparent conducting film improves, which is preferable. However, the transparency will decrease, and the film thickness should be 100-1000 nm. Furthermore, this ITO film 2 has a low heat resistance, and the electrical resistance due to heating at 300° C. or higher increases to at least 1.5 times.

A FTO film (hereafter referred to as a FTO film) 3 as a second transparent conductive film is formed on top of the ITO film 2. This FTO film 3 is formed from tin oxide doped with several ppm of fluorine, and is a thin film which displays excellent heat resistance and chemical resistance. This FTO film 3 is highly heat resistant and displays an increase in electrical resistance which is suppressed to no more than 2 times on heating at 300 to 700° C.

The thickness of this FTO film 3 must be at least 30 nm in order to protect the ITO film 2 underlayer. However, if it becomes too thick, the overall transparency decreases, and the upper limit should be 350 nm. The film thickness of this FTO film 3 largely determines the heat resistance as a transparent conducting film.

For example, if the film thickness is set to 30-350 nm, the conductivity does not decrease even due to heating at a temperature of 250-700° C. for one hour. If the film thickness is set to 100-350 nm, the conductivity does not decrease even due to heating at a temperature of 450-700° C. for one hour. If the film thickness is set to 150-350 nm, the conductivity does not decrease even due to heating at a temperature of 650-700° C. for one hour.

Therefore, it is possible to adjust the film thickness depending on the heat resistance which is required to a substrate for a transparent electrode.

The FTO film 3 can be formed using a thin film formation technique such as a SPD method, a sputtering method, or a CVD method, although of these, a SPD method is preferred.

This SPD method is a variety of thin film formation technique wherein a raw material compound solution is sprayed onto a heated substrate, a pyrolysis reaction is initiated on the substrate generating fine particles of an oxide, and these fine particles of oxide are deposited on the surface of the substrate. This type of SPD method can be used for forming a FTO film by using a solution of a tin oxide such as tin (II) oxide and a fluorine compound such as ammonium fluoride as the raw material compound solution.

Furthermore, the formation of the FTO film of the second transparent conductive film 3 must be conducted immediately after the formation of the ITO film 2 of the first transparent conductive film. The reason for this requirement is because if the ITO film 2 is exposed to a high temperature of 450 to 550° C., then the film will oxidize within a very short time period of only 2 to 3 minutes, causing a reduction in conductivity. Therefore, if the glass substrate 1 with the ITO film 2 formed thereon is heated for a second time from room temperature to the 500 to 600° C. required for formation of the FTO film 3, the ITO film 2 will deteriorate during this heating period, before the FTO film 3 of the second transparent conductive film can be formed.

As a result, it is necessary to spray the raw material compound solution for the FTO film 3 onto the glass plate 1 immediately after the formation of the ITO film 2, while the temperature of the glass plate 1 is still at approximately 400 to 500° C., and form the FTO film 3 by SPD methods before the ITO film 2 can begin to deteriorate. Accordingly, the spraying of the raw material compound solution used for forming the FTO film 3 of the second transparent conductive film must be commenced within 1 to 3 minutes of completing the formation of the ITO film 2 of the first transparent conductive film.

By employing this type of consecutive and immediate film formation operation, the surface of the ITO film 2 can be covered with the highly heat resistant FTO film 3 before the ITO film 2 undergoes oxidation deterioration. In cases in which a thin film formation method other then the aforementioned SPD method is employed in the consecutive film formation operation, the temperature during film formation of the FTO film 3 can still not be reduced to a temperature below 300° C., and consequently the same time restriction applies.

Furthermore, a method is adopted which sets the film formation temperature of the ITO film 2 to 280° C. or higher, preferably 280-460° C., when producing a substrate for a transparent electrode by providing the ITO film 2 on the transparent substrate 1 by means of a SPD method and subsequently providing the FTO film 3 on this ITO film 2 by means of the SPD method. Moreover, a method is adopted which sets the film formation temperature of the FTO film 3 to 360-440° C.

By setting the film formation temperature of the ITO film 2 to 280° C. or higher as described above, it is possible to form a low-resistance transparent conducting film with high conductivity. Furthermore, by setting the film formation temperature of the FTO film 3 to 360-440° C., it is possible to form a transparent conducting film having good heat resistance without increasing the resistance even if heating is carried out at 450° C. for one hour.

According to a transparent electrode substrate of this type of construction, the second transparent conductive film which is a FTO film 3 and which displays superior heat resistance and for which the electrical resistance does not increase appreciably even on exposure to high temperatures, is laminated on top of the first transparent conductive film 2 which is an ITO film, and covers the ITO film 2, and consequently even when exposed to high temperatures of 300° C. or higher, the ITO film 2 does not oxidize and no loss occurs in the high conductivity of the ITO film 2.

Furthermore, the FTO film of the second transparent conductive film 3 has a higher electrical resistance and a poorer transparency than an ITO film, but because the thickness of this FTO film 3 may be kept reasonably thin, the electrical resistance and the transparency of the overall laminated film structure do not deteriorate appreciably.

In addition, FTO films also offer a high degree of chemical resistance, and consequently yield an overall laminated film structure with a high degree of chemical resistance.

Furthermore, by forming the FTO film 3 immediately after the formation of the ITO film 2, oxidation deterioration of the ITO film 2 during the film formation operation for the FTO film 3 can be prevented, and no loss occurs in the high conductivity of the ITO film 2.

In addition, in the present invention, other films with similar characteristics to a FTO film can also be used for the second transparent conductive film 2, including transparent conductive films of antimony doped tin oxide (ATO), tin oxide (TO), fluorine doped zinc oxide (FZO), aluminum doped zinc oxide (AZO), gallium doped zinc oxide (GZO), boron doped zinc oxide (BZO) or zinc oxide (ZO), of film thickness from 30 to 500 nm. These transparent conductive films offer a similar high level of heat resistance to the FTO film 3, and display an increase in electrical resistance which is suppressed to no more than 2 times on heating at 300 to 700° C.

Furthermore, a third transparent conductive film and a fourth transparent conductive film and beyond, can also be formed on top of the second transparent conductive film 3, forming a plurality of layers of the aforementioned transparent conductive films other than the ITO film.

In addition, a transparent conductive film other than an ITO film may also be formed directly on top of the transparent substrate 1, with an ITO film then formed on top of this transparent conductive film, and a transparent conductive film other than an ITO film, such as a FTO film or the like, then formed on top of the ITO film.

Furthermore, the form of the transparent substrate is not restricted to a flat plate. Moreover, a substrate for a transparent electrode according to the present invention is, of course, not restricted to use as a transparent electrode plate for a dye sensitized solar cell described above, and can also be used for other devices such as photoelectric conversion elements which are exposed to high temperatures of 300° C. or higher, either during production or in subsequent use.

Figure 2:
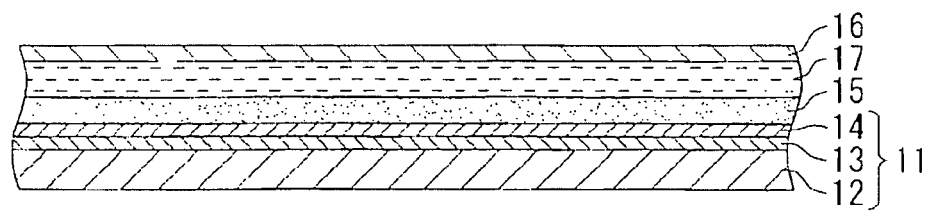
FIG. 2 is a schematic cross-sectional diagram showing an example of a dye sensitized solar cell according to the present invention.

FIG. 2 is a diagram showing one example of a dye sensitized solar cell, representing a specific example of a photoelectric conversion element of the present invention.

In FIG. 2, numeral 11 represents a transparent electrode plate. This transparent electrode plate 11 is formed from a transparent electrode substrate as described above, and comprises, for example, a transparent substrate 12 such as a glass plate on which is laminated an ITO film 13 and a FTO film 14.

On top of the FTO film 14 of this transparent electrode plate 11 is formed an oxide semiconductor porous film 15. This oxide semiconductor porous film 15 is a porous film of thickness 1 to 50 μm μm constructed of interconnected fine particles of a metallic oxide which displays semiconductivity such as titanium oxide, tin oxide, tungsten oxide, zinc oxide, zirconium oxide or niobium oxide, with the interior of the film containing countless fine vacancies, the surface comprising fine undulations, and with the internal fine vacancies supporting a photosensitized dye.

Formation of this oxide semiconductor porous film 15 is achieved by a method in which a colloidal liquid, a paste, or a dispersion containing dispersed fine particles of the aforementioned metal oxide of average particle diameter 5 to 50 nm is applied to the surface of the FTO film 14 of the transparent electrode plate 11 using an application method such as screen printing, ink jet printing, roll coating, doctor coating, spin coating, spray coating or bar coating, and is subsequently baked at a temperature of 400 to 600° C.

Furthermore, suitable examples of photosensitized dyes include ruthenium complexes incorporating ligands such as bipyridine structures or terpyridine structures, metal complexes of porphyrins or phthalocyanine, and organic dyes such as eosin, rhodamine and merocyanine, and by impregnating the fine cavities within the oxide semiconductor porous film 15 with an aqueous solution or an alcohol solution of this type of dye and performing subsequent drying, the dye is supported in the cavities.

In FIG. 2, numeral 16 represents a counter electrode. This counter electrode 16 may comprise a conductive substrate such as a metal plate, a non-conductive substrate such as a glass plate with a conductive film of platinum, gold or carbon or the like formed thereon using a technique such as vapor deposition or sputtering, or an electrode formed by applying a chloroplatinic acid solution to a substrate, and then heating the electrode to form a platinum film.

An electrolyte formed from a nonaqueous solution incorporating a redox pair such as iodine and iodide ions is used to fill the gap between the aforementioned oxide semiconductor porous film 15 and the counter electrode 16, forming an electrolyte layer 17.

In a dye sensitized solar cell of this construction, if light such as sunlight enters from the side of the transparent electrode plate 11, then an electromotive force develops between the transparent electrode plate 11 and the counter electrode 16, and electrons flow from the transparent electrode plate 11 to the counter electrode 16, producing power generation.

According to this type of dye sensitized solar cell, because the uppermost layer of the transparent electrode substrate which forms the transparent electrode plate 11 is a highly heat resistant FTO film 14, even during the heating required for the baking of the oxide semiconductor porous film 15, the resistance does not increase significantly, and the low electrical resistance required for the transparent electrode plate 11 is maintained, and as a result, the photoelectric conversion efficiency of the solar cell does not deteriorate.

In a dye sensitized solar cell of the present invention, the electrolyte layer 17 formed from the electrolyte comprising a nonaqueous solution incorporating a redox pair can either employ a charge transfer layer comprising a solid inorganic p-type semiconductor such as copper iodide or copper thiocyanate, or alternatively, this charge transfer layer can employ a hole transport layer. By using such a hole transport layer, volatilization and leakage of the electrolyte can also be prevented.

As follows is a description of a series of specific examples. The examples presented comprise a glass plate onto which an ITO film, and a FTO film, an ATO film or a TO film are formed using a SPD method.

EXAMPLE 1

1. Preparation of a Raw Material Compound Solution for an ITO Film 5.58 g of indium (III) chloride tetrahydrate and 0.23 g of tin (II) chloride dihydrate were dissolved in 100 ml of ethanol, yielding an ITO film raw material compound solution.

2. Preparation of a Raw Material Compound Solution for a FTO Film 0.701 g of tin (IV) chloride pentahydrate was dissolved in 10 ml of ethanol, a saturated aqueous solution of 0.592 g of ammonium fluoride was added, and the mixture was placed in an ultrasonic washer for approximately 20 minutes to achieve complete dissolution, yielding a FTO film raw material compound solution.

Subsequently, the surface of a heat resistant glass plate of thickness 2 mm was subjected to chemical cleaning, and the glass plate was then dried, placed in a reaction vessel and heated using a heater. When the heating temperature of the heater had reached approximately 450° C., the ITO film raw material compound solution was sprayed onto the plate for 25 minutes through a nozzle with a bore diameter of 0.3 mm and at a pressure of 0.06 MPa, with the nozzle separated from the glass plate by a distance of 400 mm.

Following spraying of the ITO film raw material compound solution, two minutes were allowed to elapse (during this period, ethanol was sprayed continuously onto the glass substrate surface in order to suppress any increase in the surface temperature of the substrate), and when the heating temperature of the heater reached 530° C., the FTO film raw material compound solution was sprayed onto the surface under the same conditions, for a period of 2 minutes and 30 seconds.

Through the above processes, an ITO film of thickness 530 nm and a FTO film of thickness 170 nm were formed on the heat resistant glass plate, yielding a transparent electrode plate according to the present invention.

For the purposes of comparison, identical heat resistant glass plates and the same operations were used to form a transparent electrode plate comprising only an ITO film of thickness 530 nm, and a transparent electrode plate comprising only a FTO film of thickness 180 nm.

These three different types of transparent electrode plate were placed in a heating furnace and heated, either at 450° C. for one hour in air, or at 450° C. for 2 two hours in air, and the variation in the sheet resistance, the specific resistivity, and the transparency were then evaluated. Measurements of electrical resistance were performed using the four terminal method, and measurements of transparency were performed using an ultraviolet-visible spectrophotometer at wavelengths of 500 nm and 600 nm.

The results are shown in Table 1 through Table 3. Table 1 shows the data prior to heating, Table 2 shows the data for the transparent electrode plate following heating at 450° C. for one hour in air, and Table 3 shows the data for the transparent electrode plate following heating at 450° C. for two hours in air.

TABLE 1

|  | Sheet resistance ($\Omega/\square$) | Film thickness (nm) | Specific resistivity ($\Omega \cdot cm$) | Transmittance at 500 nm (%) | Transmittance at 600 nm (%) |
| --- | --- | --- | --- | --- | --- |
| ITO film | 4.9 | 530 | $2.6 \times 10^{-4}$ | 96 | 91 |
| FTO film | 48 | 180 | $8.6 \times 10^{-4}$ | 91 | 97 |
| FTO and ITO films | 3.3 | 700 | $2.3 \times 10^{-4}$ | 84 | 86 |

TABLE 2

|  | Sheet resistance ($\Omega/\square$) | Film thickness (nm) | Specific resistivity ($\Omega \cdot cm$) | Transmittance at 500 nm (%) | Transmittance at 600 nm (%) |
| --- | --- | --- | --- | --- | --- |
| ITO film | 18 | 530 | $9.5 \times 10^{-4}$ | 90 | 84 |
| FTO film | 48 | 180 | $8.6 \times 10^{-4}$ | 92 | 96 |
| FTO and ITO films | 3.3 | 700 | $2.3 \times 10^{-4}$ | 88 | 87 |

TABLE 3

|  | Sheet resistance ($\Omega/\square$) | Film thickness (nm) | Specific resistivity ($\Omega \cdot$ cm) | Transmittance at 500 nm (%) | Transmittance at 600 nm (%) |
| --- | --- | --- | --- | --- | --- |
| ITO film | 18 | 530 | $9.5 \times 10^{-4}$ | 90 | 85 |
| FTO film | 48 | 180 | $8.6 \times 10^{-4}$ | 91 | 96 |
| FTO and ITO films | 3.3 | 700 | $2.3 \times 10^{-4}$ | 88 | 87 |

From the results shown in Table 1 through Table 3 it is evident that in the transparent electrode plate with a FTO film laminated on top of the ITO film, there is no fluctuation in electrical resistance and no deterioration in transparency, even after heating for one or two hours at 450° C. in air.

Next, dye sensitized solar cells of the structure shown in FIG. 2 were prepared using each of the three types of transparent electrode plates from the above examples.

Formation of the oxide semiconductor porous film 15 involved dispersing fine particles of titanium oxide with an average particle diameter of 230 nm in acetonitrile to form a paste, application of this paste to a transparent electrode 11 using a bar coating method to form a film of thickness 15 μm, and then drying of the paste followed by calcinating at 450° C. for one hour. A ruthenium dye was then supported in this oxide semiconductor porous film 15.

In addition, a conductive substrate comprising an ITO film and a FTO film laminated on top of a glass plate was used as the counter electrode 16, and an electrolyte solution formed from a nonaqueous solution of iodine and iodide was used as the electrolyte layer 17.

The planar dimensions of the dye sensitized solar cells prepared in this manner were 25 mm×25 mm.

Each of these dye sensitized solar cells was irradiated with artificial sunlight (AM 1.5), and the resulting power generation efficiency was determined.

The results showed that for the solar cell using a transparent electrode plate comprising both an ITO film and a FTO film, the power generation efficiency was 5.4%, whereas the result for the solar cell using a transparent electrode plate with only an ITO film was 2.7%, and the result for the solar cell using a transparent electrode plate with only a FTO film was 3.8%.

EXAMPLE 2

1. Preparation of a Raw Material Compound Solution for an ITO Film 5.58 g of indium (III) chloride tetrahydrate and 0.23 g of tin (II) chloride dihydrate were dissolved in 100 ml of ethanol, yielding an ITO film raw material compound solution.

2. Preparation of a Raw Material Compound Solution for an ATO Film 0.701 g of tin (IV) chloride pentahydrate and 0.09 g of antimony chloride was dissolved in 10 ml of ethanol, yielding an ATO film raw material compound solution.

Using this ITO film raw material compound solution and this ATO film raw material compound solution, and employing the same sequence as the example 1, an ITO film of thickness 380 nm and an ATO film of thickness 170 nm were formed on a heat resistant glass plate, yielding a transparent electrode plate according to the present invention.

For the purposes of comparison, identical heat resistant glass plates and the same operations were used to form a transparent electrode plate comprising only an ITO film of thickness 380 nm, and a transparent electrode plate comprising only an ATO film of thickness 170 nm.

These three different types of transparent electrode plate were placed in a heating furnace and heated, either at 450° C. for one hour in air, or at 450° C. for 2 two hours in air, and the variation in the sheet resistance, the specific resistivity, and the transparency were then evaluated. Measurements of electrical resistance were performed using the four terminal method, and measurements of transparency were performed using an ultraviolet-visible spectrophotometer at wavelengths of 500 nm and 600 nm.

The results are shown in Table 4 through Table 6. Table 4 shows the data prior to heating, Table 5 shows the data for the transparent electrode plate following heating at 450° C. for one hour in air, and Table 6 shows the data for the transparent electrode plate following heating at 450° C. for two hours in air.

TABLE 4

|  | Sheet resistance ($\Omega/\square$) | Film thickness (nm) | Specific resistivity ($\Omega \cdot$ cm) | Transmittance at 500 nm (%) | Transmittance at 600 nm (%) |
| --- | --- | --- | --- | --- | --- |
| ITO film | 4.6 | 380 | $1.8 \times 10^{-4}$ | 85 | 95 |
| ATO film | $1.5 \times 10^2$ | 170 | $2.5 \times 10^{-3}$ | 83 | 90 |
| ATO and ITO films | 5.3 | 550 | $2.9 \times 10^{-4}$ | 83 | 91 |

TABLE 5

|  | Sheet resistance (Ω/□) | Film thickness (nm) | Specific resistivity (Ω · cm) | Transmittance at 500 nm (%) | Transmittance at 600 nm (%) |
| --- | --- | --- | --- | --- | --- |
| ITO film | 18 | 380 | $6.8 \times 10^{-4}$ | 91 | 85 |
| ATO film | $2.3 \times 10^{2}$ | 170 | $3.9 \times 10^{-3}$ | 83 | 90 |
| ATO and ITO films | 6.4 | 550 | $3.5 \times 10^{-4}$ | 83 | 92 |

TABLE 6

|  | Sheet resistance (Ω/□) | Film thickness (nm) | Specific resistivity (Ω · cm) | Transmittance at 500 nm (%) | Transmittance at 600 nm (%) |
| --- | --- | --- | --- | --- | --- |
| ITO film | 20 | 380 | $7.6 \times 10^{-4}$ | 92 | 87 |
| ATO film | $2.6 \times 10^{2}$ | 170 | $4.4 \times 10^{-3}$ | 83 | 90 |
| ATO and ITO films | 6.9 | 550 | $3.8 \times 10^{-4}$ | 84 | 92 |

EXAMPLE 3

1. Preparation of a Raw Material Compound Solution for an ITO Film 5.58 g of indium (III) chloride tetrahydrate and 0.23 g of tin (II) chloride dihydrate were dissolved in 100 ml of ethanol, yielding an ITO film raw material compound solution.

2. Preparation of a Raw Material Compound Solution for a TO Film 0.701 g of tin (IV) chloride pentahydrate was dissolved in 10 ml of ethanol, yielding a TO film raw material compound solution.

Using this ITO film raw material compound solution and this TO film raw material compound solution, and employing the same sequence as the example 1, an ITO film of thickness 420 nm and a TO film of thickness 160 nm were formed on a heat resistant glass plate, yielding a transparent electrode plate according to the present invention.

For the purposes of comparison, identical heat resistant glass plates and the same operations were used to form a transparent electrode plate comprising only an ITO film of thickness 420 nm, and a transparent electrode plate comprising only a TO film of thickness 160 nm.

These three different types of transparent electrode plate were placed in a heating furnace and heated, either at 450° C. for one hour in air, or at 450° C. for 2 two hours in air, and the variation in the sheet resistance, the specific resistivity, and the transparency were then evaluated. Measurements of electrical resistance were performed using the four terminal method, and measurements of transparency were performed using an ultraviolet-visible spectrophotometer at wavelengths of 500 nm and 600 nm.

The results are shown in Table 7 through Table 9. Table 7 shows the data prior to heating, Table 8 shows the data for the transparent electrode plate following heating at 450° C. for one hour in air, and Table 9 shows the data for the transparent electrode plate following heating at 450° C. for two hours in air.

TABLE 7

|  | Sheet resistance (Ω/□) | Film thickness (nm) | Specific resistivity (Ω · cm) | Transmittance at 500 nm (%) | Transmittance at 600 nm (%) |
| --- | --- | --- | --- | --- | --- |
| ITO film | 4.0 | 420 | $1.7 \times 10^{-4}$ | 86 | 95 |
| TO film | $5.8 \times 10^{2}$ | 160 | $9.3 \times 10^{-3}$ | 85 | 98 |
| TO and ITO films | 5.6 | 580 | $3.3 \times 10^{-4}$ | 82 | 96 |

TABLE 8

|  | Sheet resistance (Ω/□) | Film thickness (nm) | Specific resistivity (Ω · cm) | Transmittance at 500 nm (%) | Transmittance at 600 nm (%) |
| --- | --- | --- | --- | --- | --- |
| ITO film | 17 | 420 | $7.1 \times 10^{-4}$ | 88 | 95 |
| TO film | $9.7 \times 10^{2}$ | 160 | $1.6 \times 10^{-2}$ | 87 | 98 |
| TO and ITO films | 6.6 | 580 | $3.8 \times 10^{-4}$ | 83 | 96 |

TABLE 9

| | Sheet resistance ($\Omega/\square$) | Film thickness (nm) | Specific resistivity ($\Omega \cdot cm$) | Transmittance at 500 nm (%) | Transmittance at 600 nm (%) |
|---|---|---|---|---|---|
| ITO film | 18 | 420 | $7.6 \times 10^{-4}$ | 88 | 95 |
| TO film | $1.1 \times 10^3$ | 160 | $1.8 \times 10^{-2}$ | 87 | 97 |
| TO and ITO films | 6.9 | 580 | $4.0 \times 10^{-4}$ | 84 | 96 |

From the results shown in Table 4 through Table 9 it is evident that, even if an ATO film or a TO film is laminated on top of the ITO film instead of the FTO film, essentially the same results can be obtained.

EXAMPLE 4

Using the same raw material compound solution for an ITO film and raw material compound solution for a FTO film as in Example 1, a transparent electrode plate was obtained by carrying out a film formation operation using the same SPD method, forming an ITO film having a thickness of 450 nm on heat resistant glass (CORNING #7059, 10 mm×10 mm×1.1 mm), and forming 9 different types of FTO films having thicknesses of 0-350 nm thereon.

These 9 types of transparent electrode plates were heated in a heating furnace at temperatures between 250-700° C. for one hour in air, and the sheet resistance after film forming and the sheet resistance after heating were measured.

The results are shown in Table 10.

TABLE 10

| Film thickness of FTO film (nm) | Sheet resistance during film forming ($\Omega/\square$) | Sheet resistance after one hour at 250° C. ($\Omega/\square$) | Sheet resistance after one hour at 300° C. ($\Omega/\square$) | Sheet resistance after one hour at 450° C. ($\Omega/\square$) | Sheet resistance after one hour at 650° C. ($\Omega/\square$) | Sheet resistance after one hour at 700° C. ($\Omega/\square$) |
|---|---|---|---|---|---|---|
| 0 | 4.2 | 6.9 | 10.2 | 18.5 | 18.6 | 18.6 |
| 30 | 4.0 | 4.0 | 4.0 | 4.5 | 10.4 | 15.5 |
| 60 | 4.0 | 4.0 | 4.0 | 4.1 | 9.6 | 12.3 |
| 100 | 4.3 | 4.3 | 4.3 | 4.3 | 6.0 | 9.1 |
| 150 | 3.8 | 3.8 | 3.8 | 3.8 | 4.5 | 5.5 |
| 200 | 3.9 | 3.9 | 3.9 | 3.9 | 4.2 | 4.9 |
| 250 | 3.8 | 3.8 | 3.8 | 3.8 | 4.1 | 4.7 |
| 300 | 3.9 | 3.9 | 3.9 | 3.9 | 4.0 | 4.5 |
| 350 | 4.0 | 4.0 | 4.0 | 4.0 | 4.0 | 4.2 |

It can be understood from the results of Table 10 that in order to obtain a transparent electrode plate whose conductivity does not decrease even if heated at 250° C. for one hour in air, for example, the thickness of the FTO film may be set to 30 nm, and in order to obtain a transparent electrode plate whose conductivity does not decrease even if heated at 700° C. for one hour in air, the thickness of the FTO film may be set to a minimum of 150 nm.

EXAMPLE 5

Using the same raw material compound solution for an ITO film and raw material compound solution for a FTO film as in Example 1, a transparent electrode plate was obtained by carrying out a film formation operation using the same SPD method, forming 8 different types of ITO film having thicknesses of 100-1400 nm on heat resistant glass (Corning #7059, 10 mm×10 mm×1.1 mm), and forming a FTO film having a thickness of 150 nm thereon.

The sheet resistance after film forming and the light transmittance (550 nm wavelength, absorption of heat resistant glass plate of the substrate was subtracted) of these 8 types of transparent electrode plates were measured. The sheet resistance of the transparent electrode plates after heating at 450° C. for one hour in air was also measured.

The results are shown in Table 11.

TABLE 11

| ITO film thickness (nm) | Sheet resistance during film forming ($\Omega/\square$) | Sheet resistance after one hour at 450° C. ($\Omega/\square$) | Transmittance (550 nm) (%) |
|---|---|---|---|
| 100 | 13.5 | 13.5 | 97 |
| 200 | 7.0 | 7.0 | 96 |
| 400 | 4.8 | 4.8 | 95 |
| 600 | 2.3 | 2.3 | 91 |
| 800 | 1.5 | 1.5 | 89 |
| 1000 | 1.3 | 1.3 | 81 |
| 1200 | 1.0 | 1.0 | 76 |
| 1400 | 0.79 | 0.79 | 70 |

It can be understood from the results of Table 11 that if the thickness of the ITO film exceeds 1000 nm, the light transmittance begins to decrease. Furthermore, it can be understood that if a FTO film having the required thickness is present and is coated, there is absolutely no effect on the heat resistance thereof even if the film thickness of the ITO film is varied.

EXAMPLE 6

1. Preparation of Raw Material Compound Solution for an ITO Film 3.33 g of indium chloride (III) tetrahydrate and 0.135 g of tin chloride (II) dihydrate were dissolved in 60 ml of ethanol, thereby producing the raw material compound solution for an ITO film.

2. Preparation of Raw Material Compound Solution for a FTO Film 0.701 g of tin chloride (IV) pentahydrate was dissolved in 10 ml of ethanol. 0.592 g of a saturated aqueous solution of ammonium fluoride was added thereto. This mixture was placed in an ultrasonic washer for about 20 minutes and completely dissolved, thereby producing the raw material compound solution for a FTO film.

Using this raw material compound solution for an ITO film and raw material compound solution for a FTO film, a transparent electrode plate was obtained by carrying out a film formation operation using the same SPD method as in Example 1, forming 13 types of ITO film on heat resistant glass (Corning #7059, 10 mm×10 mm×1.1 mm) by varying the film formation temperature from 220-460° C., and subsequently forming a FTO film thereon at a film formation temperature of 400° C.

These 13 types of transparent electrode plates were heated in a heating furnace at 450° C. for one hour in air, and the sheet resistance and specific resistance after film forming as well as the sheet resistance, specific resistance, and transmittance after heating were measured.

The results are shown in Table 12.

2. Preparation of Raw Material Compound Solution for a FTO Film 0.20 M of tin chloride (IV) pentahydrate was dissolved in ethanol. 0.32 M of a saturated aqueous solution of ammonium fluoride was added thereto. This mixture was placed in an ultrasonic washer for about 20 minutes and completely dissolved, thereby producing the raw material compound solution for a FTO film.

Using this raw material compound solution for an ITO film and raw material compound solution for a FTO film, a transparent electrode plate was obtained by carrying out a film formation operation using the same SPD method as in Example 1, forming an ITO film (thickness: 570 nm) on heat resistant glass (Corning #7059, 10 mm×10 mm×1.1 mm) at a film formation temperature of 350° C., and subsequently

TABLE 12

| Film formation temperature of ITO film (° C.) | Sheet resistance during film forming (Ω/□) | Film thickness (nm) | Specific resistance during film forming (Ω · cm) | Sheet resistance after one hour at 450° C. (Ω/□) | Specific resistance after one hour at 450° C. (Ω/□) | Transmittance (550 nm) (%) |
|---|---|---|---|---|---|---|
| 220 | 181 | 300 | $5.4 \times 10^{-3}$ | 181 | $5.4 \times 10^{-3}$ | 96 |
| 240 | 30.6 | 480 | $1.4 \times 10^{-3}$ | 30.6 | $1.4 \times 10^{-3}$ | 95 |
| 260 | 11.2 | 500 | $5.7 \times 10^{-4}$ | 11.2 | $5.7 \times 10^{-4}$ | 94 |
| 280 | 3.5 | 600 | $2.1 \times 10^{-4}$ | 3.5 | $2.1 \times 10^{-4}$ | 93 |
| 300 | 3.1 | 680 | $2.1 \times 10^{-4}$ | 3.1 | $2.1 \times 10^{-4}$ | 92 |
| 320 | 3.0 | 720 | $2.2 \times 10^{-4}$ | 3.0 | $2.2 \times 10^{-4}$ | 92 |
| 340 | 2.7 | 780 | $2.0 \times 10^{-4}$ | 2.7 | $2.0 \times 10^{-4}$ | 91 |
| 360 | 2.4 | 830 | $2.0 \times 10^{-4}$ | 2.4 | $2.0 \times 10^{-4}$ | 90 |
| 380 | 2.0 | 950 | $1.9 \times 10^{-4}$ | 2.0 | $1.9 \times 10^{-4}$ | 88 |
| 400 | 1.8 | 1000 | $1.8 \times 10^{-4}$ | 1.8 | $1.8 \times 10^{-4}$ | 87 |
| 420 | 1.6 | 1100 | $1.8 \times 10^{-4}$ | 1.6 | $1.8 \times 10^{-4}$ | 83 |
| 440 | 1.5 | 1200 | $1.8 \times 10^{-4}$ | 1.5 | $1.8 \times 10^{-4}$ | 81 |
| 460 | 1.3 | 1350 | $1.8 \times 10^{-4}$ | 1.3 | $1.8 \times 10^{-4}$ | 78 |

It is clear from the results of Table 12 that when the film formation temperature of the ITO film is 280-460° C., it is possible to form a low-resistance transparent electrode film.

EXAMPLE 7

1. Preparation of Raw Material Compound Solution for an ITO Film 3.33 g of indium chloride (III) tetrahydrate and 0.135 g of tin chloride (II) dihydrate were dissolved in 60 ml of ethanol, forming 12 types of FTO film (thickness: 180 nm) thereon by varying the film formation temperature from 240-460° C.

These 12 types of transparent electrode plates were heated in a heating furnace at 450° C. for one hour in air, and the sheet resistance and specific resistance after film forming as well as the sheet resistance, specific resistance, and transmittance after heating were measured.

The results are shown in Table 13.

TABLE 13

| Film formation temperature of FTO film (° C.) | Sheet resistance during film forming (Ω/□) | Film thickness (nm) | Specific resistance during film forming (Ω · cm) | Sheet resistance after one hour at 450° C. (Ω/□) | Specific resistance after one hour at 450° C. (Ω/□) | Transmittance (550 nm) (%) |
|---|---|---|---|---|---|---|
| 240 | 2.6 | 750 | $2.0 \times 10^{-4}$ | 5.0 | $3.8 \times 10^{-4}$ | 89 |
| 260 | 2.6 | 750 | $2.0 \times 10^{-4}$ | 4.8 | $3.6 \times 10^{-4}$ | 88 |
| 280 | 2.6 | 750 | $2.0 \times 10^{-4}$ | 4.8 | $3.6 \times 10^{-4}$ | 89 |
| 300 | 2.6 | 750 | $2.0 \times 10^{-4}$ | 4.8 | $3.6 \times 10^{-4}$ | 87 |
| 320 | 2.6 | 750 | $2.0 \times 10^{-4}$ | 4.8 | $3.6 \times 10^{-4}$ | 88 |
| 340 | 2.6 | 750 | $2.0 \times 10^{-4}$ | 3.5 | $2.6 \times 10^{-4}$ | 88 |
| 360 | 2.6 | 750 | $2.0 \times 10^{-4}$ | 2.8 | $2.1 \times 10^{-4}$ | 89 |
| 380 | 2.6 | 750 | $2.0 \times 10^{-4}$ | 2.6 | $2.0 \times 10^{-4}$ | 87 |
| 400 | 2.6 | 750 | $2.0 \times 10^{-4}$ | 2.6 | $2.0 \times 10^{-4}$ | 89 |
| 420 | 2.6 | 750 | $2.0 \times 10^{-4}$ | 2.6 | $2.0 \times 10^{-4}$ | 88 |
| 440 | 2.6 | 750 | $2.0 \times 10^{-4}$ | 2.9 | $2.2 \times 10^{-4}$ | 88 |
| 460 | 2.6 | 750 | $2.0 \times 10^{-4}$ | 3.4 | $2.6 \times 10^{-4}$ | 86 |

It can be understood from the results of Table 13 that by setting the film formation temperature of the FTO film 3 to 360-440° C., a transparent electrode layer having excellent heat resistance can be formed while maintaining low resistance even after heating at 450° C. for one hour in air.

What is claimed is:

1. A method of producing a substrate for a transparent electrode comprising:

forming an indium tin oxide film on a transparent substrate at 280° C. or higher by means of a spray pyrolysis deposition method; and subsequently forming a fluorine doped tin oxide film on the indium tin oxide film by means of a spray pyrolysis deposition method, wherein a raw material compound solution used for forming the fluorine doped tin oxide film is sprayed within 1 to 3 minutes of completing the formation of the indium tin oxide film.

2. A method of producing a substrate for a transparent electrode comprising:

forming an indium tin oxide film on a transparent substrate by means of a spray pyrolysis deposition method; and subsequently forming a fluorine doped tin oxide film on the indium tin oxide film at a temperature of about 360 to about 440° C. by means of a spray pyrolysis deposition method, wherein a raw material compound solution used for forming the fluorine doped tin oxide film is sprayed within 1 to 3 minutes of completing the formation of the indium tin oxide film.

3. A method of producing a substrate for a transparent electrode comprising:

forming an indium tin oxide film on a transparent substrate at 280° C. or higher by means of a spray pyrolysis deposition method; and subsequently forming a fluorine doped tin oxide film on the indium tin oxide film at a temperature of about 360 to about 440° C. by means of a spray pyrolysis deposition method, wherein a raw material compound solution used for forming the fluorine doped tin oxide film is sprayed within 1 to 3 minutes of completing the formation of the indium tin oxide film.

4. The method according to claim 1, wherein the forming of the fluorine doped tin oxide film occurs while a temperature of the transparent substrate is approximately 400° C.-500° C.

5. The method according to claim 2, wherein the forming of the fluorine doped tin oxide film occurs while a temperature of the transparent substrate is approximately 400° C.-500° C.

6. The method according to claim 3, wherein the forming of the fluorine doped tin oxide film occurs while a temperature of the transparent substrate is approximately 400° C.-500° C.

7. The method according to claim 1, wherein forming the indium tin oxide film on the transparent substrate is at 280° C.-360° C. by means of a spray pyrolysis deposition method.

8. The method according to claim 2, wherein forming the indium tin oxide film on the transparent substrate is at 280° C.-360° C. by means of a spray pyrolysis deposition method.

9. The method according to claim 3, wherein forming the indium tin oxide film on the transparent substrate is at 280° C.-360° C. by means of a spray pyrolysis deposition method.

* * * * *